United States Patent

Liu

[15] 3,665,339

[45] May 23, 1972

[54] SELF-PULSED MICROWAVE OSCILLATOR

[72] Inventor: Shing-Gong Liu, Princeton, N.J.

[73] Assignee: The United States of America as represented by the United States Atomic Energy Commission

[22] Filed: Sept. 25, 1970

[21] Appl. No.: 75,416

[52] U.S. Cl. ..............................331/107 R, 331/96, 331/99, 333/84 M

[51] Int. Cl. ..........................................................H03b 7/14

[58] Field of Search.....................333/84 M; 331/107, 96, 99

[56] References Cited

UNITED STATES PATENTS 3,548,339 12/1970 Barber et al. ..........................331/107

*Primary Examiner*—John Kominski
*Attorney*—Edward J. Norton

[57] ABSTRACT

A pulse forming network, comprising a delay device and a matching resistor, is used to control the bias signal necessary for activating a negative resistance semiconductor device into microwave oscillations. The delay device is designed to control the duration of microwave oscillation and the matching resistor controls the period between output pulses.

10 Claims, 4 Drawing Figures

Patented May 23, 1972 3,665,339

INVENTOR.
SHING-GONG LIU
BY
Edward J. Norton
Attorney

SELF-PULSED MICROWAVE OSCILLATOR

The invention herein described was made in the course of or under a contract or subcontract thereunder with the Atomic Energy Commission.

DESCRIPTION OF THE PRIOR ART

The pulsing of microwave energy generated by a negative resistance semiconductive device has been accomplished by using a modulator that controls the bias signal used to activate the negative resistance semiconductive device. The circuitry used in the modulator is complicated to design, especially when a high duty cycle is required. Other problems may also arise because the rise time of the resultant pulse is often not fast enough for some applications. The modulator is also relatively inefficient to operate, and the large size required for modulator design is inconsistent with the miniaturized microwave oscillator.

An electronically controlled microwave switch, connected in series between the microwave oscillator and the output load has also been used to pulse microwave output power. The switch can provide an r.f. path for the oscillator output power to either the output load or a microwave absorbant termination. Thus, by operating the oscillator CW, the microwave power to the output load will appear to be pulsed when a programmed power supply dictates to the switch which path the oscillator output power will follow. Although the power requirements for operating the switch are less than for a modulator as above, a second bias circuit for controlling the switch is needed. Also, by operating the oscillator CW, the efficiency of the oscillator is decreased.

SUMMARY OF THE INVENTION

The principle object of the present invention is the design of a self-pulsed microwave oscillator. The source of microwave oscillations is a negative resistance semiconductive device complemented by a microwave resonant circuit. The negative resistance semiconductive device is activated into generating microwave oscillations by applying a bias signal exceeding a predetermined threshold value. A simple pulse forming network, consisting of a delay device and a matching resistor, is responsive to the bias signal and arranged to periodically cause the bias signal to exceed the predetermined threshold value. The delay device is designed to control the pulse width and the matching resistor controls the period between output microwave pulses.

These and other objects, features and advantages of the invention will be better understood from a consideration of the following specification taken in conjunction with the accompanying drawing in which:

DESCRIPTION OF THE PREFERRED EMBODIMENT

Figures 1, 2, 3, 4:
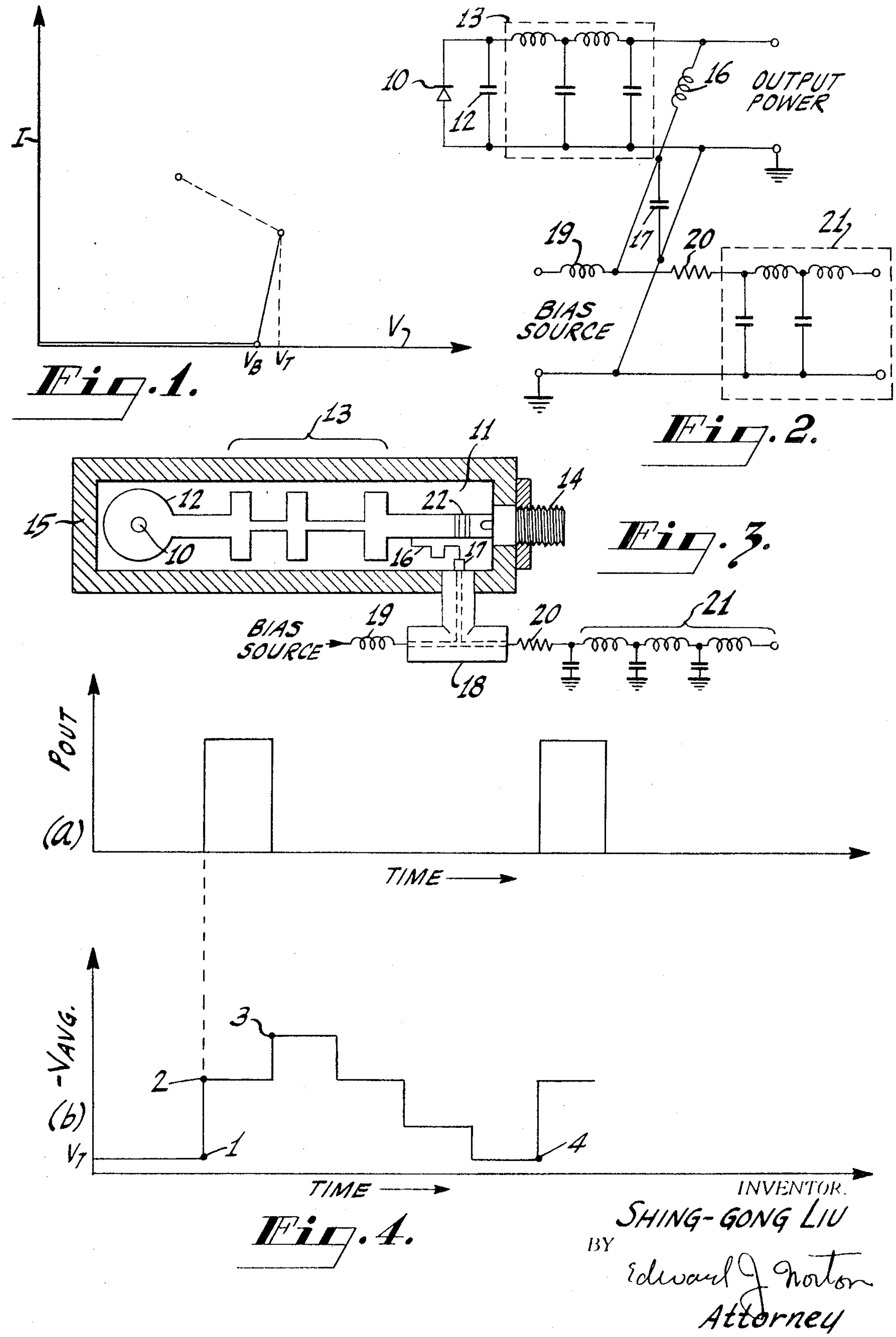
FIG. 1 is a plot of D.C. current I versus D.C. bias voltage V for a typical p-n junction negative resistance semiconductive device used in the present invention.
FIG. 2 is a schematic diagram of a self-pulsed high efficiency mode avalanche diode oscillator according to one embodiment of the invention.
FIG. 3 is a top, pictorial view of a self-pulsed high efficiency mode avalanche diode oscillator according to the invention, FIG. 4, curves *a* and *b*, is a plot of output microwave power, $P_{out}$, versus time and the corresponding average terminal voltage across the diode, $-V_{avg}$, versus time.

Referring now to FIG. 1, there is shown the D.C. current I vs. the D.C. voltage V characteristics for a p-n junction negative resistance semiconductive device. As the voltage V is increased, the current I is negligible until a certain breakdown voltage $V_B$ is reached. Beyond $V_B$, the current I begins to increase until at a threshold voltage, $V_T$, the semiconductive device breaks into microwave oscillations. Coincident with microwave oscillation, the current I increases and the voltage V decreases. This is illustrated by the dotted line in FIG. 1.

Referring now to FIG. 2 and 3, there is shown a self-pulsed negative resistance semiconductive device oscillator comprising an avalanche diode 10 coupled to a microwave resonant circuit. The microwave resonant circuit utilizes the techniques of microstrip transmission line in its design and construction. Electrically conductive material on the top surface of a dielectric substrate 11 is chemically etched or otherwise formed to leave a radial transmission line capacitor 12 in series with a low-pass filter 13. The avalanche diode 10 is connected in shunt at the center of the radial transmission line capacitor 12. The low-pass filter 13 is designed to match the complex impedance of the avalanche diode 10 to a terminating load impedance connected to the output coaxial connector 14. The center conductor of the output coaxial connecter 14 is coupled to the low-pass filter 13. The low-pass filter 13 also reflects energy at frequencies higher than the fundamental frequency of oscillation. The reflected energy is stored by the radial transmission line capacitor 12 and when fully charged, the capacitor 12 will trigger the high efficiency mode of operation of the avalanche diode 10. The bottom surface of the dielectric substrate 11, not shown, is metal clad by any suitable means to provide a ground planar conductor for the microwave resonant circuit and to which one terminal of the diode 10 is connected. The conductor is electrically connected to a conductive housing 15 which serves as a ground plane. The outer conductor of the coaxial connector 14 is connected to the ground planar conductor via the housing 15.

A bias circuit comprising a high impedance lead 16 terminated by an r.f. bypass capacitor 17 is connected to the microwave resonant circuit after the low-pass filter. It is connected at this point to optimize the design of the bias circuit at the fundamental frequency oscillation. The bias circuit is designed to present a high impedance at microwave frequencies. Therefore, r.f. isolation is provided for any circuit or source connected to the center conductor of a tee type coaxial bias connector 18 coupled to the r.f. bypass capacitor 17 in the bias circuit. A high inductance choke 19 is connected in series with the center conductor of one of the ports of the tee type coaxial bias connector 18 and a direct current bias source, not shown, which may be pulsed or continuous D.C. The high inductance choke 19 will present a high impedance or open circuit to any current pulse generated by the diode 10. A tunable pulse forming network, comprising a matching resistor 20 in series with a delay device 21, is connected to the center conductor of the remaining port of the tee type coaxial bias connector 18. The delay device 21 which may be a length of open-circuited coaxial cable and matching resistor 20 may also be connected in series between the bias connector 18 and the high inductance choke 19 provided the impedance of the choke 19 will appear as an open circuit to a current pulse. In order to prevent D.C. leakage to the terminating load, a D.C. blocking capacitor 22 is connected in series between the low-pass filter 13 and the output coaxial connector 14.

Referring now to FIG. 4, there is shown the effect of the pulse forming network on the output microwave oscillation and the diode 10 terminal voltage. The bias signal at point 1 is at the threshold voltage $V_T$, and the avalanche diode 10 will break into oscillation. There is a typical voltage decrease in diode terminal voltage associated with the period of microwave oscillation. This is indicated by point 2. Concurrent with the terminal voltage decrease, the diode 10 generates a current pulse. The current pulse travels in the direction of the delay line 21 and is reflected by an open circuit at the end of the delay line. Due to the negative resistance characteristic of the diode 10, a further reduction in terminal voltage, $V_T$, is caused by the reflected current pulse when it reaches the diode terminals. This further reduction in terminal voltage is indicated by point 3. The dynamic impedance of the diode 10 is drastically changed by the further reduction in terminal voltage. The impedance of the microwave resonant circuit will no longer match the new dynamic impedance of the diode 10, causing a cessation of microwave oscillations. The duration of the delay line 21 controls the round trip time of the reflected current pulse to reach the diode 10 terminals and thus, the output pulse width of the self-pulsed oscillator.

The combined impedance of the diode 10 and matching resistor 20 can be tuned to reflect the returning current pulse back through the delay line 21. Each time the current pulse completes a round trip, the amplitude of the current pulse will be attenuated and the terminal voltage will increase until the threshold voltage at point 4 is reached and the diode 10 will again break into oscillation. The number of round trips the current pulse will make before the diode 10 will again oscillate, is determined by the impedance match between the delay line 21, and the combined impedance of the diode 10 and resistor 20. Thus, the matching resistor 20 connected in series between the delay line 21 and the diode 10 can control the period between microwave pulses. If resistor 20 is selected to improve the impedance match between the delay line 21 and diode 10, the period between microwave pulses will decrease and vice versa. It should be noted that the dynamic impedance of the diode 10 can be effected by the impedance presented by the resonant microwave circuit. Therefore, tuning the resonant microwave circuit can also change the period between microwave pulses. Using the arrangement described, avalanche-diode oscillator circuits have been operated at an L-band frequency with 50 per cent duty cycle at a peak power level of 12 W.

While a particular avalanche diode oscillator is shown, the invention directed to a self-pulsing technique for microwave devices can be used in the manner taught with other types of microwave circuits. Thus, a Gunn diode oscillator or other negative resistance semiconductor diode oscillator may be used in practicing the invention.

In practicing the invention, the oscillator frequency is determined by the type of oscillator circuit used and the application made thereof.

What is claimed is:

1. A self-pulsed oscillator comprising:

an active element having at least two input terminals and exhibiting a current-voltage characteristic including a negative resistance portion, the d.c. impedance between said terminals of said element decreasing when a direct current bias signal exceeding a predetermined threshold value is applied thereto, a microwave resonant circuit including said element for generating oscillations at a given frequency during periods when the amplitude of said bias signal applied to said terminals exceeds said threshold value, means including a delay device responsive to said decrease in said impedance for causing said signal to periodically exceed said threshold value and operate said element with said resonant circuit to produce said oscillations at said given frequency at intervals determined by the impedance match between said device and said element.

2. A self-pulsed oscillator in accordance with claim 1, in which said microwave resonant circuit is a microstrip transmission line circuit having one of said input terminals of said active element coupled to the center of a radial transmission line capacitor, and the other input terminal of said active element coupled to the ground plane of said microstrip transmission line, the complex impedance of said active element being matched to the impedance of a terminating load by a low pass filter connected in series between said radial transmission line capacitor and said terminating load.

3. A self-pulsed oscillator in accordance with claim 1, including a circuit coupled to said microwave resonant circuit for applying said bias signal across said active element, said circuit being designed to present a high impedance at r.f. frequencies.

4. A self-pulsed oscillator in accordance with claim 3, said delay device being a two terminal delay line open-circuited at one terminal thereof, means connecting the other terminal of said delay line to said circuit so that, said delay line is responsive to said decrease in said impedance to control the duration of said microwave oscillations.

5. A self-pulsed oscillator in accordance with claim 3, including means connecting said delay device in series between said circuit and a source of direct current energy.

6. A self-pulsed oscillator in accordance with claim 3, said responsive means further including a matching resistive device connected with said delay device and said circuit and arranged to control the interval between said microwave oscillations.

7. In an oscillator of the type including an active element exhibiting a current-voltage characteristic having a negative resistance portion, the direct current impedance across said element decreasing when a bias signal exceeding a predetermined threshold value is applied thereto, whereupon said oscillator oscillates at a given frequency, concurrent with said decreasing impedance, a direct current energy pulse being generated by said element, means for applying said bias signal to said element and said oscillator over a path including means arranged in said path to reflect said pulse back to said element in a manner to lower said bias signal below said threshold value, thereafter to allow said bias signal to again exceed said threshold value, said element and said oscillator being operated by said means to produce said oscillations for predetermined periods, the interval between said periods being determined by the impedance match between said means and said element.

8. In an oscillator as claimed in claim 7, said means to reflect said pulse including an open-circuited delay line to one end of which is applied said direct current energy pulse from said element, said reflected pulse being fed back to said element from said one end of said delay line, the time of said periods during which said oscillator oscillates being determined by the parameters of said delay line.

9. In an oscillator as claimed in claim 8, a matching resistor connected in said path with said delay line and responsive to said pulse received by said delay line and said reflected pulse returned by said delay line, so as to determine the interval between said periods of oscillation.

10. In an oscillator as claimed in claim 7, said path including an open-circuited delay line, a matching resistor, a high inductance choke, means connecting said choke, said resistor and said delay line in series, the free end of said choke connected to the terminal of a source of direct current energy, means for applying the direct current energy appearing at the junction of said choke and said resistor as said bias signal to said oscillator.

* * * * *